United States Patent
Ma et al.

(10) Patent No.: US 10,965,265 B2
(45) Date of Patent: Mar. 30, 2021

(54) METHOD AND DEVICE FOR ADJUSTING AUDIO SIGNAL, AND AUDIO SYSTEM

(71) Applicant: Harman International Industries, Incorporated, Stamford, CT (US)

(72) Inventors: Guilin Ma, Suzhou (CN); Zhe Chen, Suzhou (CN)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/609,302

(22) PCT Filed: May 4, 2017

(86) PCT No.: PCT/CN2017/082997
§ 371 (c)(1),
(2) Date: Oct. 29, 2019

(87) PCT Pub. No.: WO2018/201374
PCT Pub. Date: Nov. 8, 2018

(65) Prior Publication Data
US 2020/0195214 A1   Jun. 18, 2020

(51) Int. Cl.
*H03G 3/32* (2006.01)
*H03G 3/30* (2006.01)
*H03G 5/16* (2006.01)

(52) U.S. Cl.
CPC ............. *H03G 3/32* (2013.01); *H03G 3/3005* (2013.01); *H03G 5/165* (2013.01)

(58) Field of Classification Search
CPC ........ H03G 3/32; H03G 3/3005; H03G 3/165; H03G 3/20; H03G 3/3089; H03G 5/00; H03G 5/025; H04R 2430/01

(Continued)

(56) References Cited

U.S. PATENT DOCUMENTS 4,864,246 A * 9/1989 Kato .................. H03G 3/32
330/129
5,790,671 A * 8/1998 Cooper ................ H03G 3/32
381/103

(Continued)

FOREIGN PATENT DOCUMENTS

CN     102405494 A     4/2012
CN     103259898 A     8/2013

(Continued)

OTHER PUBLICATIONS

Brian C.J. Moore, et al., A Model for the Prediction of Thresholds, Loudness and Partial Loudness; JAES vol. 45 issue 4 pp. 224-240 dated Apr. 1997, Department of Experimental Psychology, University of Cambridge, Cambridge CB2 3EB, UK.

(Continued)

*Primary Examiner* — Xu Mei
(74) *Attorney, Agent, or Firm* — Angela M. Brunetti

(57) ABSTRACT

A method and a device for adjusting an audio signal, and an audio system are provided. The method includes: obtaining a candidate audio signal (S1); obtaining a current noise signal in an environment (S2); calculating a first plurality of difference values in loudness between the candidate audio signal and the current noise signal (S3); modifying the first plurality of difference values with a plurality of target factors, where the plurality of target factors are obtained based on a plurality of test noise signals and a corresponding plurality of test audio signals (S4); and modifying the candidate audio signal with the modified first plurality of difference values to obtain a target audio signal (S5). Therefore, loudness loss of the audio signal perceived due to the noise signal can be compensated, and an overcompensation issue can be solved.

20 Claims, 5 Drawing Sheets

(58) Field of Classification Search
USPC .................................. 381/57, 104, 107, 109
See application file for complete search history.

(56) References Cited

U.S. PATENT DOCUMENTS

| | | | |
|---|---|---|---|
| 8,275,154 B2* | 9/2012 | Moon .................... | H03G 9/025 381/108 |
| 8,498,430 B2* | 7/2013 | Hess ....................... | H03G 3/32 381/107 |
| 8,964,998 B1 | 2/2015 | McClain | |
| 9,515,627 B2* | 12/2016 | Li ............................ | H03G 3/20 |
| 9,735,746 B2* | 8/2017 | Christoph .............. | H03G 9/025 |
| 10,594,283 B2* | 3/2020 | Ma .......................... | H03G 3/32 |
| 2006/0126856 A1* | 6/2006 | Chien ..................... | H03G 3/32 381/57 |
| 2008/0253586 A1 | 10/2008 | Wei | |
| 2010/0272290 A1 | 10/2010 | Carroll | |
| 2013/0094669 A1* | 4/2013 | Kono ...................... | G10L 25/48 381/107 |
| 2014/0016791 A1* | 1/2014 | Smith .................... | H03G 9/025 381/57 |
| 2014/0086422 A1* | 3/2014 | Huang ..................... | H03G 3/32 381/57 |

FOREIGN PATENT DOCUMENTS

| | | |
|---|---|---|
| CN | 103580630 A | 2/2014 |
| CN | 104468930 A | 3/2015 |

OTHER PUBLICATIONS

Ramo Jussi et al, Perceptual Frequency Response Simulator for Music in Noisy Environments, Conference: 45th International Conference: Applications of Time-Frequency Processing in Audio; Mar. 2012, AES, 60 East 42nd Street, Room 2520, New York 10165-2520, USA, Mar. 1, 2012, XP040574529, Chapter 3.2.

* cited by examiner

METHOD AND DEVICE FOR ADJUSTING AUDIO SIGNAL, AND AUDIO SYSTEM

CROSS-REFERENCE TO RELATED APPLICATIONS

This application is the national phase of International Application No. PCT/CN2017/082997, filed on May 4, 2017, and entitled "METHOD AND DEVICE FOR ADJUSTING AUDIO SIGNAL AND AUDIO SYSTEM".

FIELD

The present disclosure generally relates to audio signal processing field, and more particularly, to a method for adjusting an audio signal, a device for adjusting an audio signal, and an audio system.

BACKGROUND

In presence of an environment noise, audio signal loudness of an audio playback device perceived by listeners may get influenced by the competing sound of noise. Since audio loudness is a psychoacoustic correlation of physical strength of an audio signal, the perceived audio loudness may decrease with the competing sound level increasing. More theoretical fundamentals on audio loudness may be referred to an article of Moore, Brian C. J. et al., published in JAES VOLUME 45 issue 4 pp. 224-240 dated April 1997.

Practices have been taken to acoustically optimize audio systems, but have limited effect on achieving good acoustics in a poor acoustic environment.

Therefore, there is a need for a method for improving acoustics performance of an audio playback device under a noisy environment.

SUMMARY

According to an embodiment of the present disclosure, a method for obtaining a plurality of target factors for adjusting an audio signal is provided. The method for obtaining a plurality of target factors for adjusting an audio signal includes: obtaining a test audio signal and a test noise signal, where the test noise signal has a frequency band covering a preset number of barks; obtaining a plurality of difference values in loudness between the test audio signal and the test noise signal; and determining a particular target factor of the plurality of target factors for a particular bark for modifying the plurality of difference values, where the particular target factor ranges from 0 to 1 and is determined based on a predetermined requirement.

In some embodiments, the method further includes: repeating above steps until a first predetermined number of target factors for the first predetermined number of barks are obtained based on a plurality of test noise signals and a corresponding plurality of test audio signals.

In some embodiments, the method further includes: obtaining a second predetermined number of target factors for the second predetermined number of barks, by using a linear interpolation method based on the first predetermined number of target factors and the first predetermined number of barks.

In some embodiments, obtaining the plurality of difference values in loudness between the test audio signal and the test noise signal includes: calculating Power Spectral Density (PSD) of the test audio signal in a frequency domain and PSD of the test noise signal in the frequency domain respectively; processing the PSD of the test audio signal in the frequency domain and the PSD of the test noise signal in the frequency domain with a psychoacoustic masking model respectively, to obtain an audio signal in a decibel (dB) scale in a bark domain and to obtain a noise signal in the dB scale in the bark domain; and calculating the plurality of difference values in the dB scale in the bark domain by performing a subtraction between the test audio signal in the dB scale in the bark domain and the test noise signal in the dB scale in the bark domain.

In some embodiments, determining the particular target factor for the particular bark for modifying the plurality of difference values includes: modifying the plurality of difference values in the dB scale in the bark domain with a particular factor, where the particular factor varies between 0 and 1; obtaining a plurality of linear gain values in a frequency domain based on the modified plurality of difference values in the dB scale in the bark domain; modifying the test audio signal with the plurality of linear gain values; monitoring playback of the modified test audio signal; and tuning the particular factor for the particular bark in the center of the frequency band of the test noise signal until the modified test audio signal meets the predetermined requirement.

In some embodiments, the test noise signal has the frequency band overlapping at least part of a frequency band of the test audio signal.

In some embodiments, the test noise signal has the frequency band covering 3 to 5 barks.

According to an embodiment of the present disclosure, a device for obtaining a plurality of target factors for adjusting an audio signal is also provided correspondingly. The device for obtaining a plurality of target factors for adjusting an audio signal includes: a first obtaining circuitry, configured to obtain a test audio signal and a test noise signal, where the test noise signal has a frequency band covering a preset number of barks; a second obtaining circuitry, configured to obtain a plurality of difference values in loudness between the test audio signal and the test noise signal; and a determining circuitry, configured to determine a particular target factor of the plurality of target factors for a particular bark for modifying the plurality of difference values, where the particular target factor ranges from 0 to 1 and is determined based on a predetermined requirement.

According to an embodiment of the present disclosure, a method for adjusting an audio signal is provided. The method for adjusting an audio signal includes: obtaining a candidate audio signal; obtaining a current noise signal in an environment; calculating a first plurality of difference values in loudness between the candidate audio signal and the current noise signal; modifying the first plurality of difference values with a plurality of target factors, where the plurality of target factors are obtained based on a plurality of test noise signals and a corresponding plurality of test audio signals; and modifying the candidate audio signal with the modified first plurality of difference values to obtain a target audio signal.

In some embodiments, obtaining the plurality of target factors based on the plurality of test noise signals and the corresponding plurality of test audio signals includes: obtaining a first predetermined number of target factors for the first predetermined number of barks, so as to obtain a relationship between the first predetermined number of target factors and the first predetermined number of barks, where each of the first predetermined number of barks is at a center of a frequency band of a test noise signal; and obtaining a second predetermined number of target factors corresponding to the second predetermined number of barks in a bark domain that are not at centers of frequency bands of the plurality of test noise signals, by using a linear interpolation method based on the relationship between the first predetermined number of target factors and the first predetermined number of barks.

In some embodiments, obtaining a particular target factor of the predetermined number of target factors for a particular bark of the predetermined number of barks includes: obtaining a test noise signal and a test audio signal, wherein the test noise signal has a frequency band covering a preset number of barks; obtaining a second plurality of difference values in a decibel (dB) scale in the bark domain by performing a subtraction between the test noise signal and the test audio signal; modifying the second plurality of difference values in the dB scale in the bark domain with a particular target factor, where the particular target factor varies from 0 to 1; obtaining a second plurality of linear gain values in the frequency domain based on the modified second plurality of difference values in the dB scale in the bark domain; modifying the test audio signal with the second plurality of linear gain values; monitoring playback of the modified test audio signal; and tuning the particular target factor for the particular bark in the center of the frequency band of the test noise signal until the modified test audio signal meets a predetermined requirement.

In some embodiments, the test noise signal has the frequency band overlapping at least part of a frequency band of the test audio signal.

In some embodiments, the test noise signal has the frequency band covering 3 to 5 barks.

In some embodiments, the first plurality of difference values in loudness between the candidate audio signal and the current noise signal are obtained by: obtaining a Power Spectral Density (PSD) of the candidate audio signal in a frequency domain and a PSD of the current noise signal in the frequency domain respectively; processing the PSD of the candidate audio signal in the frequency domain and the PSD of the current noise signal in the frequency domain with a psychoacoustic masking model respectively, to obtain a candidate audio signal in a dB scale in a bark domain and a current noise signal in the dB scale in the bark domain; and obtaining a first plurality of difference values in the dB scale in the bark domain by performing a subtraction between the candidate audio signal in the dB scale in the bark domain and the current noise signal in the dB scale in the bark domain.

In some embodiments, modifying the candidate audio signal with the modified first plurality of difference values to obtain the target audio signal includes: transforming the obtained first plurality of difference values in the dB scale in the bark domain to a third plurality of difference values in the dB scale in the frequency domain using a linear interpolation method; obtaining a first plurality of linear gain values in the frequency domain based on the third plurality of difference values in the dB scale in the frequency domain; and performing a multiplication between the candidate audio signal and the first plurality of linear gain values in the frequency domain, to obtain the target audio signal in the frequency domain.

In some embodiments, the method for adjusting an audio signal further includes: transforming the target audio signal from the frequency domain to a time domain; and outputting the target audio signal in the time domain.

In some embodiments, the method for adjusting an audio signal further includes: performing a time and frequency smoothing and a non-linear smoothing successively to the PSD of the current noise signal in the frequency domain; and performing the time and frequency smoothing to the PSD of the candidate audio signal in the frequency domain, before processing the PSD of the candidate audio signal in the frequency domain and the PSD of the current noise signal in the frequency domain with the psychoacoustic masking model respectively.

In some embodiments, the method for adjusting an audio signal further includes: performing a tone correction to the PSD of the current noise signal in the frequency domain, before processing the PSD of the candidate audio signal in the frequency domain and the PSD of the current noise signal in the frequency domain with the psychoacoustic masking model respectively; where the tone correction is obtained based on flatness measurements on a plurality of subbands.

In some embodiments, the candidate audio signal is a multi-channel audio signal in a time domain, the method further includes: transforming the multi-channel audio signal from the time domain to the frequency domain; and averaging the multi-channel audio signal in the frequency domain to obtain a mono audio signal in the frequency domain so as to calculate PSD of the mono audio signal in the frequency domain as the PSD of the candidate audio signal in the frequency domain.

According to an embodiment of the present disclosure, an audio system is provided. The audio system includes: an audio playback device, configured to play audio signals; a microphone, configured to detect noise signals in an environment; a storage device configured to store a plurality of target factors, where the plurality of target factors are adapted to modify audio signals; and a processor configured to: obtain a candidate audio signal to be played by the audio playback device; obtain a current noise signal detected by the microphone; calculate a first plurality of difference values in loudness between the candidate audio signal and the current noise signal; modify the first plurality of difference values with the plurality of target factors; modify the candidate audio signal with the modified first plurality of difference values to obtain a target audio signal; and control the audio playback device to play the target audio signal.

In some embodiments, the plurality of target factors are obtained according to the method for obtaining a plurality of target factors for adjusting an audio signal described above.

In some embodiments, the audio playback device is a headphone.

In some embodiments, the microphone is an inline microphone of the headphone.

In some embodiments, the storage device and the processor are integrated in the audio playback device.

In some embodiments, the audio system further includes a main device, where the audio playback device communicates with the main device, and the storage device and the processor are integrated in the main device.

Compared with the conventional technology, the present disclosure has the following advantages.

In presence of noise signals in the environment, a first plurality of difference values in loudness between the candidate audio signal and the current noise signal are calculated and modified with a plurality of target factors, and then the candidate audio signal are modified with the modified first plurality of difference values to obtain a target audio signal, so that the loudness loss of a perceived audio signal due to the competing sound of the noise signal can be compensated. The plurality of target factors are obtained based on a plurality of test noise signals and a corresponding plurality of test audio signals covering a broad frequency band, which makes the plurality of target factors adaptive to almost all of noise signals in the environment.

Further, the plurality of target factors are obtained for each bark in the bark domain, so that the first plurality of difference values can be modified at each bark, and the candidate audio signal can be adjusted accurately so as to avoid overcompensation as far as possible.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION OF EMBODIMENTS

Figure 1:
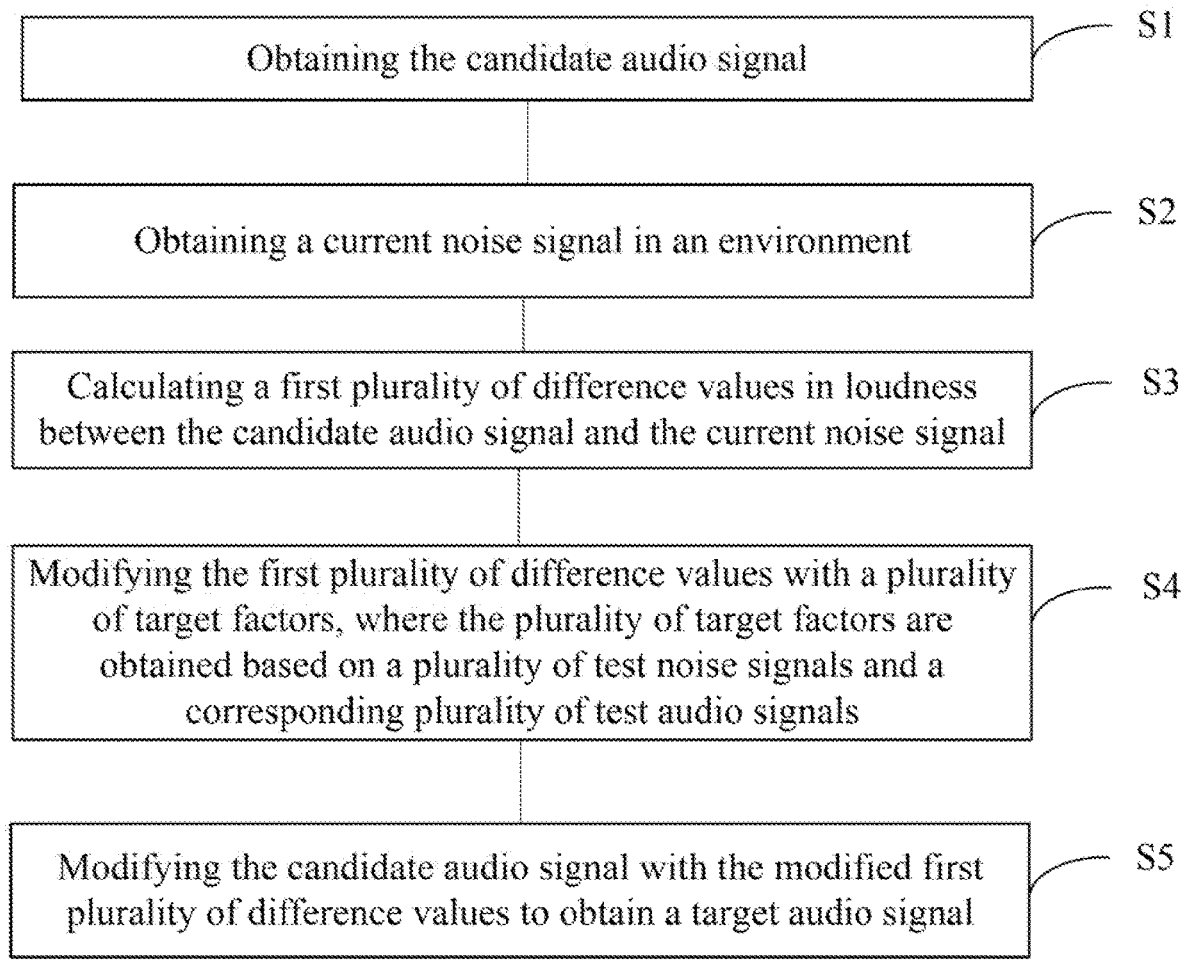
FIG. 1 schematically illustrates a flow chart of a method for adjusting a candidate audio signal according to an embodiment of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Referring to FIG. 1, FIG. 1 schematically illustrates a flow chart of a method for adjusting a candidate audio signal according to an embodiment of the present disclosure. The method includes steps S1, S2, S3, S4, and S5.

In S1, the candidate audio signal is obtained. In some embodiments, the obtained candidate audio signal is in a time domain.

In S2, a current noise signal in an environment is obtained. Specifically, the current noise signal may refer to any competing sound in surroundings interfering with the audio signal of interest.

As aforementioned, loudness of an audio signal perceived by listeners may get influenced by a noise signal in an environment. In some embodiments of the present disclosure, the candidate audio signal may be adjusted by a first plurality of difference values in loudness between the candidate audio signal and the current noise signal, so as to offset masking effect of the current noise signal produced on the candidate audio signal in a psychoacoustic model.

In S3, a first plurality of difference values in loudness between the candidate audio signal and the current noise signal are calculated.

However, research by the inventors indicates that, if an absolute difference in loudness between the candidate audio signal and the current noise signal is directly applied to compensating the candidate audio signal, the candidate audio signal will be overcompensated.

In order to solve the overcompensation issues, in S4, the plurality of difference values are modified with a plurality of target factors, where the plurality of target factors are obtained based on a plurality of test noise signals and a corresponding plurality of test audio signals. In some embodiments, the plurality of target factors are greater than zero and less than one so as to attenuate the first plurality of difference values.

In S5, the candidate audio signal is modified with the modified first plurality of difference values to obtain a target audio signal.

In some embodiments, modifying the candidate audio signal with the modified first plurality of difference values includes: obtaining a first plurality of linear gain values based on the modified first plurality of difference values; and performing a multiplication between the candidate audio signal and the first plurality of linear gain values in a frequency domain to obtain a target audio signal in the frequency domain.

In some embodiments, the method for adjusting the candidate audio signal shown in FIG. 1 may further include: transforming the target audio signal from the frequency domain to the time domain, and outputting the target audio signal in the time domain.

In other embodiments, modifying the candidate audio signal with the modified first plurality of difference values may include: obtaining a first plurality of linear gain values based on the modified first plurality of difference values; and performing a convolution between the candidate audio signal and the first plurality of linear gain values in the time domain to obtain a target audio signal in the time domain. Then, the method for adjusting the candidate audio signal may further include outputting the target audio signal in the time domain.

Figure 2:
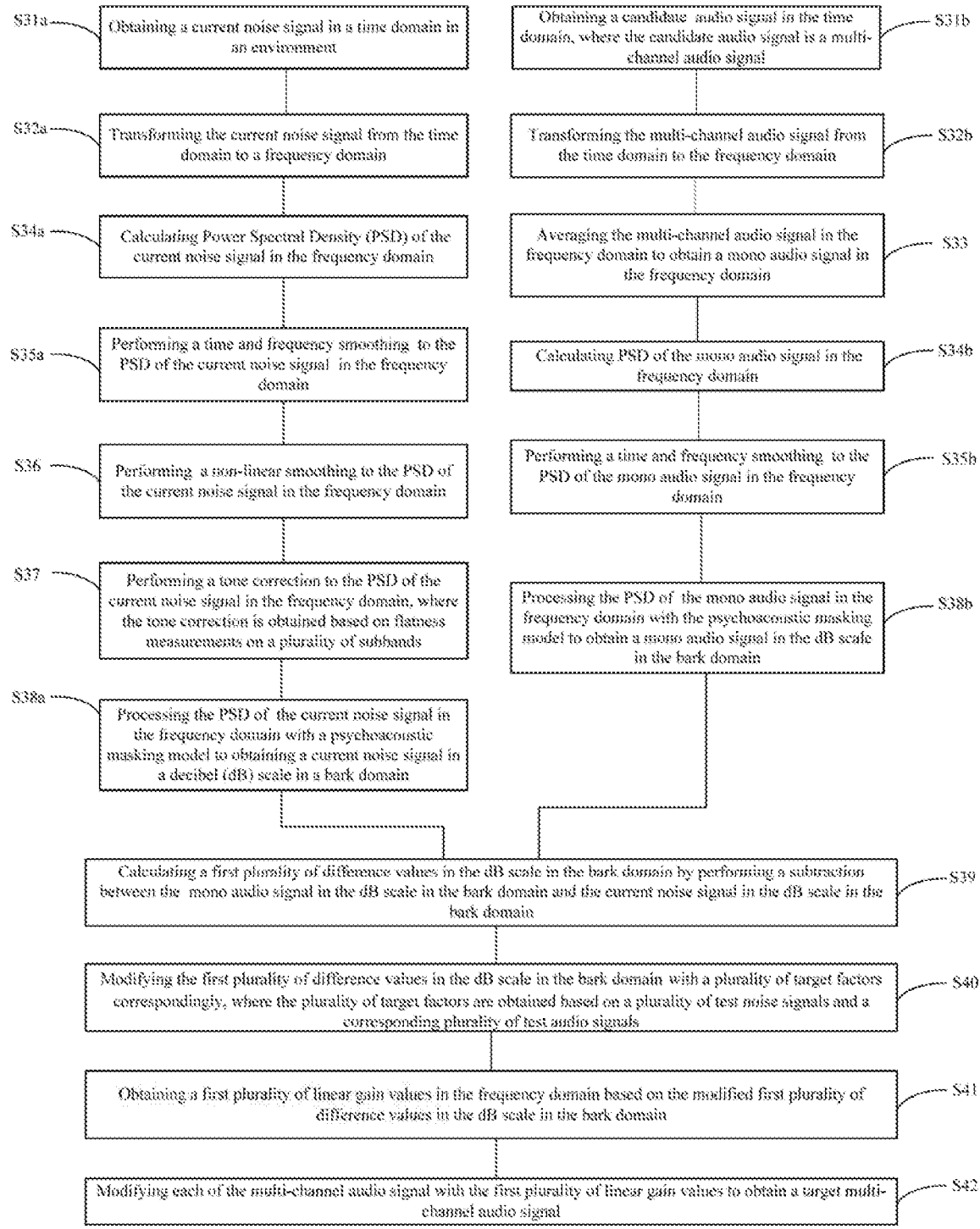
FIG. 2 schematically illustrates a flow chart of a method for adjusting a candidate audio signal according to another embodiment of the present disclosure.

With reference to FIG. 2, FIG. 2 schematically illustrates a flow chart of a method for adjusting a candidate audio signal according to another embodiment of the present disclosure. The method includes the following steps.

In S31a and S31b, a current noise signal in a time domain in an environment and a candidate audio signal in the time domain are obtained respectively, where the candidate audio signal is a multi-channel audio signal.

In S32a and S32b, the current noise signal and the multi-channel audio signal are transformed from the time domain to a frequency domain respectively. Specifically, the multi-channel audio signal and the current noise signal may be transformed from the time domain to the frequency domain using, for example, a Fast Fourier Transform (FFT) method.

In S33, the multi-channel audio signal in the frequency domain is averaged to obtain a mono audio signal in the frequency domain. Specifically, a summation operation is performed to the multi-channel audio signal in the frequency domain, and then an arithmetic average of the summation in the frequency domain is derived. All the following processing on the candidate audio signal is performed to the mono audio signal. In other embodiments, a more accurate loudness summation can be performed to the multi-channel audio signal according to a psychoacoustic model. It should be noted that, when the candidate audio signal is a mono audio signal, the step S33 can be omitted.

In S34a and S34b, Power Spectral Density (PSD) of the current noise signal in the frequency domain and PSD of the mono audio signal in the frequency domain are calculated respectively.

In S35a and S35b, a time and frequency smoothing is performed respectively to the PSD of the current noise signal in the frequency domain and the PSD of the mono audio signal in the frequency domain, so as to simulate human perception of various noise sound. The inventors have found that, the noise signals with different frequencies require different smoothing factors. Specifically, heavy smoothing should be applied to high frequency noise signals, while slight smoothing should be applied to low frequency noise signals, so that the smoothing intensity is inversely proportional to the frequency resolution in each bark.

In S36, a non-linear smoothing is performed to the PSD of the current noise signal in the frequency domain, so that when the noise signal is detected, the compensation can not be triggered too early, and when the noise signal ends, the compensation needs to be terminated immediately.

In S37, a tone correction is performed to the PSD of the current noise signal in the frequency domain, where the tone correction is obtained based on flatness measurements on a plurality of subbands.

Specifically, in reference of a psychoacoustic model, the tone correction (i.e. attenuation) is quantified by:

$$\text{ToneOffset}=\text{Sharpness}*(14.5+\text{Barks})+(1-\text{Sharpness})*5.5 \quad (1)$$

where "14.5+Barks" and "5.5" are respectively correction values in decibel (dB) for an ideal tone (Sharpness=1) and an ideal white noise (Sharpness=0), Sharpness is derived by flatness measurements, values of the Sharpness corresponding to different barks are usually normalized between 0 and 1.

Considering the noises to be corrected by equation (1) usually have a quite wide bandwidth, while the noise signal in the present embodiment is relatively narrow, the equation (1) for determining the tone correction should be modified.

In some embodiments, the tone correction is quantified by:

$$\text{ToneOffset}=\text{Sharpness}*(14.5+\text{Barks}+1+30)+(1-\text{Sharpness})*5.5 \quad (2)$$

Wherein the Sharpness is derived by flatness measurements, the flatness measurement is performed to a plurality of subbands which are derived by dividing a full band into a number of subbands. In one embodiment, a full band of noise covering a frequency band from 20 Hz to 20000 Hz is divided into eight to ten subbands firstly, and then flatness of each of the eight to ten subbands is measured. However, the number of the subbands divided from the fill band should not be limited thereto. Bandwidth of the subbands depends on the specific application.

Specifically, for each subband, flatness and a frequency corresponding to a maximum amplitude of noise are measured, and the measured frequencies are transformed to barks in the bark domain. With the measured flatness and barks and the equation (2), the toneoffset can be derived.

In other embodiments, other correction options may be tested for a smoother modification from low frequency to high frequency, one of which is:

$$\text{ToneOffset}=\text{Sharpness}*(14.5+\text{Barks}*2+1)+(1-\text{Sharpness})*5.5 \quad (3)$$

In S38a and S38b, the PSD of the current noise signal in the frequency domain and the PSD of the mono audio signal in the frequency domain are respectively processed with a psychoacoustic masking model, so that a psychoacoustic masking relationship between the current noise signal and the mono audio signal can be derived, and a current noise signal in a dB scale in a bark domain and a mono audio signal in the dB scale in the bark domain can be obtained.

It will be appreciated by those skilled in the art that a psychoacoustic model is generally used in researching sound perception, as well as masking effect between a signal and a masker. The specific processing on the PSD of the noise signal and the PSD of the mono audio signal in the bark domain by the psychoacoustic masking model will not be discussed in detail hereinafter.

In S39, a first plurality of difference values in the dB scale in the bark domain are calculated by performing a subtraction between the mono audio signal in the dB scale in the bark domain and the current noise signal in the dB scale in the bark domain obtained in the S38a and S38b.

However, as aforementioned, if the first plurality of difference values are directly applied to compensate the candidate audio signal, the candidate audio signal will be overcompensated. In order to solve the overcompensation issues, a plurality of target factors are applied to modifying the first plurality of difference values so as to attenuate the first plurality of difference values.

In S40, the first plurality of difference values in the dB scale in the bark domain are modified with a plurality of target factors in the bark domain correspondingly, where the plurality of target factors in the bark domain are obtained based on a plurality of test noise signals and a corresponding plurality of test audio signals.

In some embodiments, the plurality of target factors in the bark domain are greater than zero and less than one.

In some embodiments, the plurality of target factors are tuned manually which are not adaptive in real-time.

In S41, a first plurality of linear gain values corresponding to different barks in the frequency domain are obtained based on the modified first plurality of difference values in the dB scale in the bark domain.

Specifically, the modified first plurality of difference values in the dB scale in the bark domain are transformed to a third plurality of difference values in the dB scale in the frequency domain using a linear interpolation method, and then the third plurality of difference values in the dB scale in the frequency domain are transformed to a first plurality of linear gain values in the frequency domain.

In some embodiments, when loudness of the candidate audio signal at a frequency point is larger than or equal to loudness of the current noise signal at the frequency point, the candidate audio signal at the frequency point may need not to be compensated any more. Therefore, when a difference value at a frequency point is greater than or equal to zero, that is, the candidate audio signal is larger than or equal to the current noise signal at the frequency point, then a gain value at the frequency point is set as 1; and when a difference value at a frequency point is less than zero, that is, the candidate audio signal is smaller than the current noise signal at the frequency point, then a gain value at the frequency point is set as a number greater than 1.

Thereinafter, in S42, each of the multi-channel audio signal is modified with the first plurality of linear gain values in the frequency domain so as to obtain a target multi-channel audio signal.

In some embodiments, the multi-channel audio signal is transformed from the time domain to the frequency domain firstly, and then each of the multi-channel audio signal in the frequency domain is multiplied by the first plurality of linear gain values in the frequency domain so as to obtain a target multi-channel audio signal in the frequency domain.

In some embodiments, the target multi-channel audio signal is transformed from the frequency domain to the time domain and then the target multi-channel audio signal in the time domain is output.

In other embodiments, the first plurality of linear gain values are transformed from the frequency domain to the time domain, and then each of the multi-channel audio signal in the time domain is convolved with the first plurality of linear gain values in the time domain so as to obtain a target multi-channel audio signal in the time domain, where the convolution may be achieved through an Infinite Impulse Response (IIR) filter or a Finite Impulse Response (FFR) filter. Then, the target multi-channel audio signal in the time domain can be output.

Research by the inventors indicates that, the candidate audio signal at different frequencies should be compensated differently, therefore in some embodiments, the plurality of target factors are determined individually for each bark in the bark domain.

It will be appreciated by those skilled in the art that there are 25 barks in the bark domain. Therefore 25 target factors for each of the 25 barks should be calculated.

In some embodiments, obtaining the 25 target factors includes: obtaining a first predetermined number of target factors for the first predetermined number of barks, so as to obtain a relationship between the first predetermined number of target factors and the first predetermined number of barks, where each of the first predetermined number of barks is at a center of a frequency band of a test noise signal; and obtaining the a second predetermined number of target factors in the 25 target factors corresponding to a second predetermined number of barks in the bark domain based on the relationship between the first predetermined number of target factors and the first predetermined number of barks, where the second predetermined number of target factors are a remaining number of target factors in the 25 target factors except the first predetermined number of target factors, so that a plurality of target factors corresponding to each bark in the bark domain can be obtained.

It should be noted that, the first predetermined number of target factors depends on specific requirements on test precision and test complexity. The first predetermined number of target factors may range from 2 to 25. The present invention imposes no restriction to the first predetermined number of target factors.

Figure 3:
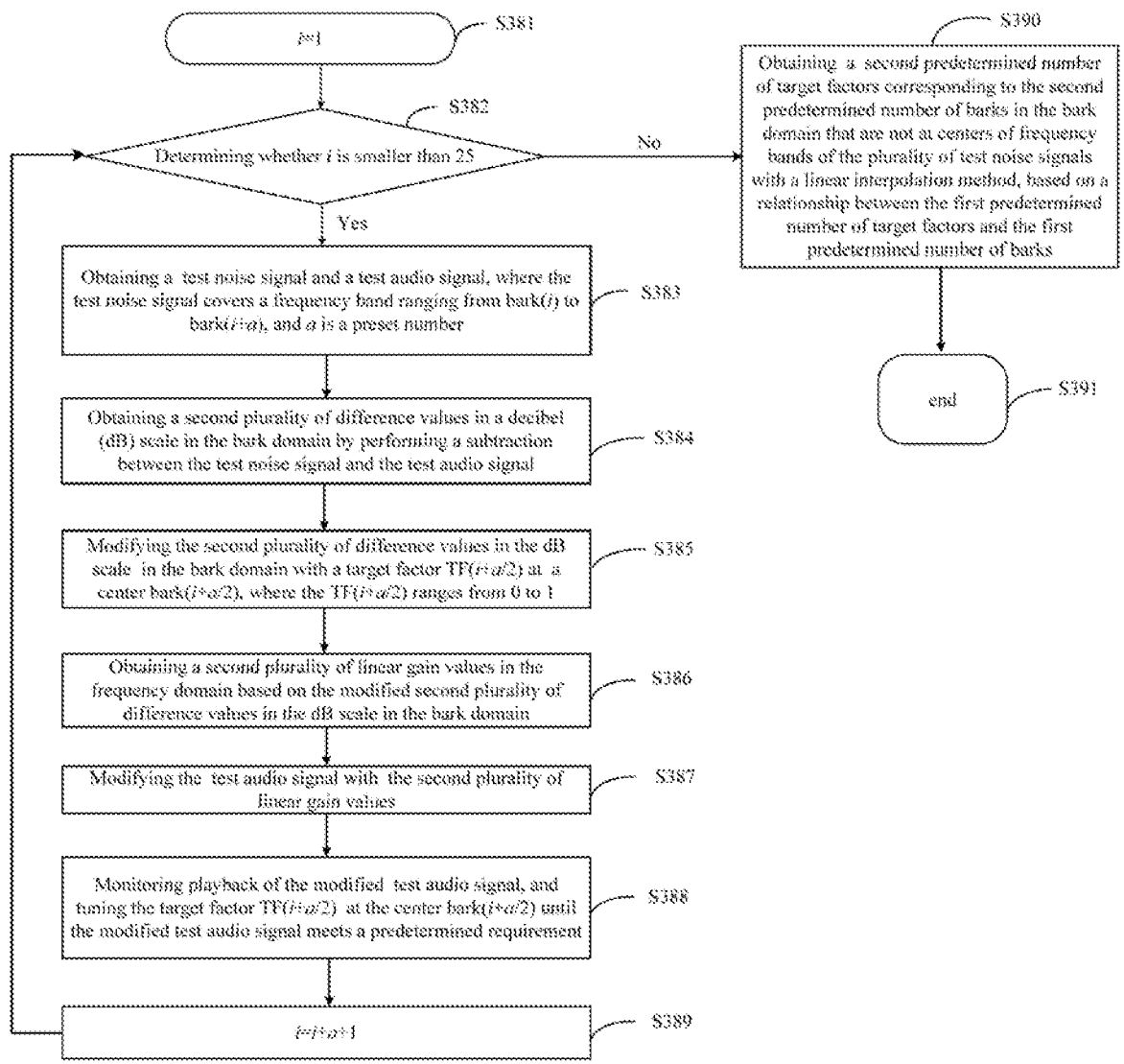
FIG. 3 schematically illustrates a flow chart of a method for obtaining a plurality of target factors according to an embodiment of the present disclosure.

With reference to FIG. 3, FIG. 3 schematically illustrates a flow chart of a method for obtaining a plurality of target factors according to an embodiment of the present disclosure. The method includes the following steps.

In S381, a variable i is set as 1.

Then, in step S382, whether the variable i is smaller than 25 is determined. If yes, the method is directed to step S383; otherwise, the method is directed to step S390.

In the step S383, a test noise signal and a test audio signal are obtained, wherein the test noise signal covers a frequency band ranging from bark(i) to bark(i+a), where a is a preset number, so that impact of spreading function in the psychoacoustic masking model can be reduced and the overall timbre impression and vocal in the audio signal can be tuned.

It is known to one of ordinary skill in the art that noise signals in natural environment normally are diverse and have a wide frequency band. In the present embodiment, a plurality of test noise signals covering different frequency bands can be simulated and applied to determining a plurality of target factors, therefore, the plurality of target factors will also be adaptive to the noise signals in the natural environment, which can be considered as various combination of the plurality of test noise signals.

In some embodiments, the test noise signal is simulated by a white noise with a bandpass filter. Optionally, a lowpass filter and a highpass filter may be applied at two cutoff frequencies of the test noise signal to increase the frequency selectivity.

In view that impact of spreading function in a psychoacoustic model can be reduced when a frequency bandwidth of the test noise signal is increased, and an overall timbre impression for instrument and vocal in music should be tuned, the test noise signal should not cover a too narrow frequency band. On the other hand, if a frequency bandwidth of the test noise signal is too large, the determined plurality of target factors will not be accurate enough. Therefore, the frequency band covered by the test noise signal should not be too wide. Thus, the first predetermined number of barks covered by the test noise signal should be neither too small nor too large, i.e. a moderate preset number a is required.

In some embodiments, the preset number a may be set as 2. That is, the test noise signal covers three barks: bark(i), bark(i+1) and bark(i+2).

In other embodiments, the preset number a may be set as 4. That is, the test noise signal covers five barks.

Then, a second plurality of difference values in loudness between the test audio signal and the test noise signal need to be obtained.

In S384, a second plurality of difference values in a decibel (dB) scale in the bark domain are obtained by performing a subtraction between the test noise signal and the test audio signal.

In some embodiments, the method for obtaining the second plurality of difference values in a dB scale in the bark domain includes: calculating Power Spectral Density (PSD) of the test audio signal in a frequency domain and PSD of the test noise signal in the frequency domain respectively; processing the PSD of the test audio signal in the frequency domain and the PSD of the test noise signal in the frequency domain with a psychoacoustic masking model respectively, to obtain an audio signal in a dB scale in a bark domain and to obtain a noise signal in the dB scale in the bark domain; and calculating the second plurality of difference values in the dB scale in the bark domain by performing a subtraction between the test audio signal in the dB scale in the bark domain and the test noise signal in the dB scale in the bark domain.

The method for obtaining the second plurality of difference values in the dB scale in the bark domain can be referred to the steps S32a to S38a, the steps S32b to S38b and the step S39 shown in FIG. 2, which will not be discussed in detail hereinafter.

In step S385, the second plurality of difference values are modified with a target factor TF(i+a/2) at a center bark(i+a/2), where the TF(i+a/2) ranges from 0 to 1. In some embodiments, an initial target factor TF(i+a/2)=1 is used. It should be noted that, the step S385 is different from the step S40 shown in FIG. 2, where the first plurality of difference values are modified with a plurality of target factors.

In step S386, a second plurality of linear gain values in the frequency domain are obtained based on the modified second plurality of difference values in the dB scale in the bark domain.

The method for obtaining the second plurality of linear gain values can be referred to the step S41 in the method shown in FIG. 2, which will not be discussed in detail hereinafter.

In S387, the test audio signal is modified with the second plurality of linear gain values. The specific method for modifying the test audio signal can be referred to the step S42 in the method shown in FIG. 2, which will not be discussed in detail herein.

In step S388, playback of the modified test audio signal is monitored and at the same time the target factor TF(i+a/2) at the center bark(i+a/2) is tuned until the modified test audio signal meets a predetermined requirement.

In some embodiments, the predetermined requirement is that the modified test audio signal sounds natural or sounds like there is no noise signal present.

In other embodiments, the predetermined requirement is that, the modified test audio signal can be slightly overcompensated in a nearly full band to improve a perceived signal-to-noise ratio.

In some embodiments, when a is an odd number, the center of the frequency band of the test audio signal is bark(i+(a−1)/2) or bark(i+(a+1)/2); and when a is an even number, the center of the frequency band of the test audio signal is bark(i+a/2).

In S389, i is increased by a+1, and the method is directed to S382.

When i is determined to be larger than or equal to 25, the method is directed to S390.

It should be noted that, before the step S390, the first predetermined number of target factors for the first predetermined number of barks are obtained, where each of the first predetermined number of barks is at a center of a frequency band of a test noise signal, so that a relationship between the calculated first predetermined number of target factors and the first predetermined number of barks can be obtained.

In S390, a second predetermined number of target factors corresponding to a second predetermined number of barks in the bark domain that are not at centers of frequency bands of the plurality of test noise signal are calculated with a linear interpolation method based on the relationship between the calculated first predetermined number of target factors and the first predetermined number of barks, so that for the barks that are not in the center of a frequency band of the test noise signal, corresponding target factors of the barks can be interpolated linearly from neighbor barks that are near the center of the frequency band of the test noise signal.

It should be noted that, in the method described above for obtaining the plurality of target factors, a first predetermined number of target factors are calculated firstly, and then a second predetermined number of target factors are calculated based on the first predetermined number of target factors, which is applied for simplifying the calculation. Actually, for determining each target factor of the plurality of target factors, the method shown in steps S381 to S389 can be applied.

In some embodiments, the preset number a may be two, three, four or five and so on.

In some embodiments, the first predetermined number a may be different in each cycle of the method shown in FIG. 3.

In some embodiments, multiple test noise signals and multiple test audio signals are applied to tuning the plurality of target factors iteratively, so that the determined plurality of target factors are adaptive for a majority of noise signals and audio signals. For example, three test audio signals and three test noise signals are provided for each cycle of the method shown in FIG. 3, if the time permits, the steps S383 to S388 in the each cycle may be performed 3 plus 3 times, so that a particular target factor is determined by using various combinations of the three test audio signals and the three noise signals.

Specifically, taking account into the spread function between barks, the plurality of target factors ranging from 0.7 to 0.9 may be determined for each bark, which can reduce the accumulated gain from neighbor barks. It should be noted that, the range of the target factors from 0.7 to 0.9 are not widely tested for various audio signals, noise signals and reference listening levels. Therefore, the plurality of target factors may have a different range for different audio signals, different noise signals and different reference listening levels in other embodiments. The present invention is not limited hereto.

With the method shown in FIG. 3, a plurality of TF(i) for bark(i) with i ranging from 1 to 25 are respectively calculated. Then the 25 target factors in the bark domain can be applied to modifying the first plurality of difference values as mentioned in FIG. 1 and FIG. 2.

As shown in FIG. 3, in each cycle of the flow chart, a test noise signal and a test audio signal are used. Therefore, the plurality of target factors are obtained based on a plurality of test noise signals and a corresponding plurality of test audio signals.

In some embodiments, frequency bands of the plurality of test noise signals range from low frequency to high frequency.

In other embodiments, frequency bands of the plurality of test noise signals range from high frequency to low frequency.

In some embodiments, the test noise signal has a frequency band overlapping at least part of a frequency band of the test audio signal.

In some embodiments, the test audio signal is bandpassed during tuning target factors for the test noise signal of each frequency band, but timbre impression of original audio signal may be harder to judge.

It should be noted that, the test audio signal with wide spectrum coverage is required for both low frequency and high frequency test noise signals, in case that the test audio signal can not cover the test noise signal in the frequency band, then it is not possible to tune target factors for the test noise signal in low frequency region or high frequency region.

In some embodiments, some classic music signals are selected as the plurality of test audio signals. In some embodiments, a sound from drum or cello, or a male voice may serve as the test audio signal, and a low frequency noise may serve as the test noise signal. In other embodiments, a sound from piano or violin, or a female voice may serve as the test audio signal, and a high frequency noise may serve as the test noise signal.

Figure 4:
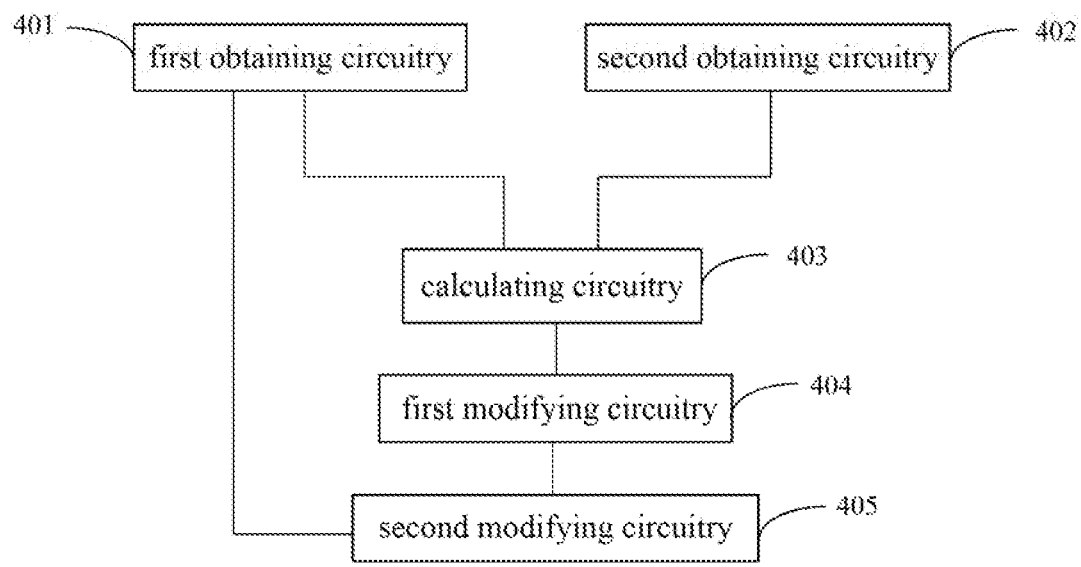
FIG. 4 schematically illustrates a device for adjusting a candidate audio signal according to an embodiment of the present disclosure.

In addition, a device for adjusting an audio signal is also provided in the present disclosure. Referring to FIG. 4, FIG. 4 schematically illustrates a device 40 for adjusting an audio signal according to an embodiment of the present disclosure.

The device 40 includes a first obtaining circuitry 401, a second obtaining circuitry 402, a calculating circuitry 403, a first modifying circuitry 404, and a second modifying circuitry 405. Where the first obtaining circuitry 401 is configured to obtain a candidate audio signal; the second obtaining circuitry 402 is configured to obtain a current noise signal in an environment; the calculating circuitry 403 is configured to calculate a first plurality of difference values in loudness between the candidate audio signal and the current noise signal; the first modifying circuitry 404 is configured to modify the first plurality of difference values with a plurality of target factors, where the plurality of target factors are obtained based on a plurality of test noise signals and a corresponding plurality of test audio signals; and the second modifying circuitry 405 is configured to modify the candidate audio signal with the modified first plurality of gain values to obtain a target audio signal.

In some embodiments, the plurality of target factors are prestored in a storage device, and the first modifying circuitry 404 is further configured to load the plurality of target factors from the storage device, so as to modify the first plurality of difference values.

The function for each of the first obtaining circuitry, the second obtaining circuitry, the calculating circuitry, the first modifying circuitry, and the second modifying circuitry can be correspondingly referred to the description on the method for adjusting the audio signal as discussed above in FIGS. 1-2, which will not be described in detail herein.

In some embodiments, the device for adjusting the candidate audio signal may be a processor, such as Central Processing Unit (CPU), Digital Signal Processor (DSP) or Field Programmable Gate Array (FPGA) etc.

In addition, an audio system is also provided in the present disclosure, for controlling audio playback.

Figure 5:
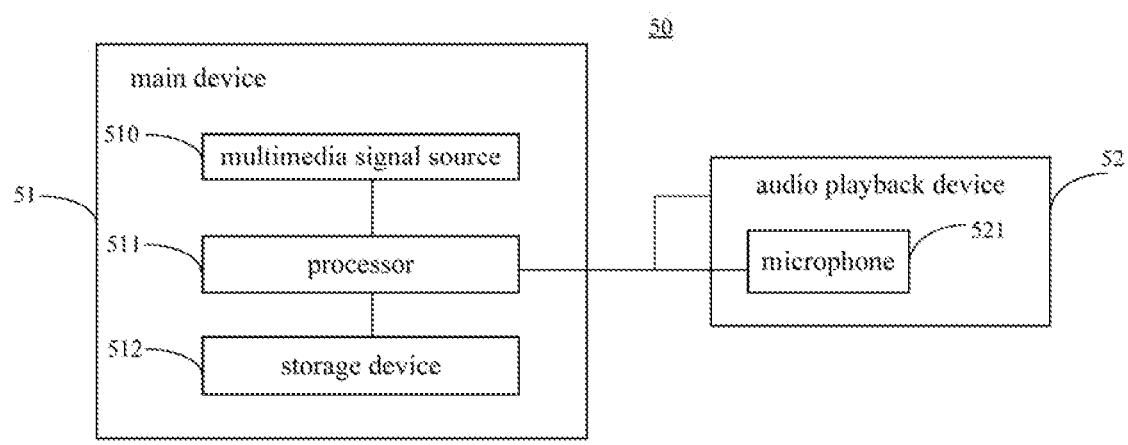
FIG. 5 schematically illustrates an audio system according to an embodiment of the present disclosure.

Referring to FIG. 5, FIG. 5 schematically illustrates an audio system 50 according to an embodiment of the present disclosure.

In some embodiments, the audio system 50 may include a main device 51 and an audio playback device 52, where the main device 51 includes a multimedia signal source 510, a processor 511 and a storage device 512, the audio playback device 52 is equipped with a microphone 521, and the audio playback device 52 communicates with the main device 51. The communication way between the audio playback device 52 and the main device 51 may be a wire or wireless style.

In some embodiments, the audio playback device 52 is a headphone, and the main device 51 is a mobile phone or a computer.

Specifically, the multimedia signal source 510 is configured to provide multimedia data. In some embodiments, the multimedia signal source 510 may be a multimedia player in a mobile phone or a computer.

The audio playback device 52 is configured to play audio signals of the multimedia data. In some embodiments, the audio playback device 52 may be a headphone. In other embodiments, an external loudspeaker or an earphone may serve as the audio playback device 52.

The microphone 521 is configured to detect noise signals in an environment. In some embodiments, the microphone 521 may be a microphone separated from the audio playback device 52. In other embodiments, the audio playback device 52 is a headphone, and the microphone 521 may be an inline microphone integrated in the headphone through audio wires.

It should be noted that, an audio signal played by the audio playback device 52 is isolated acoustically from the microphone 521. The isolation can be achieved by setting a far enough distance between the audio playback device 52 and microphone 521, and good control of leakage of the audio playback device. If the audio playback device 52 is a headphone with an inline microphone on audio wires, both the headphone and the inline microphone need to be acoustically calibrated by a reference microphone.

The storage device 512 is configured to store a plurality of target factors in a bark domain, where the plurality of target factors are obtained based on a plurality of test noise signals and a corresponding plurality of test audio signals. The storage device may be a Secure Digital (SD) card, an optical disk or a magnetic disk and so on. The method for obtaining the plurality of target factors can be referred to FIG. 3, which will not be discussed in detail herein.

The processor 511 is configured to: obtain a candidate audio signal to be played by the audio playback device 52; obtain a current noise signal detected by the microphone 521; calculate a first plurality of difference values in loudness between the candidate audio signal and the current noise signal; modify the first plurality of difference values with the plurality of target factors stored in the storage device 512; modify the candidate audio signal with the modified first plurality of difference values to obtain a target audio signal; and control the audio playback device 52 to play the target audio signal. The processor 511 may be a CPU, DSP or FPGA etc.

In some embodiments, before the processor 511 modifying the first plurality of difference values with the plurality of target factors, the processor 511 is further configured to load the plurality of target factors from the storage device 512.

The function of the processor 511 can be correspondingly referred to the description on the methods shown in FIGS. 1-2 and the device for adjusting the audio signal shown in FIG. 4, which will not be discussed in detail herein.

Figure 6:
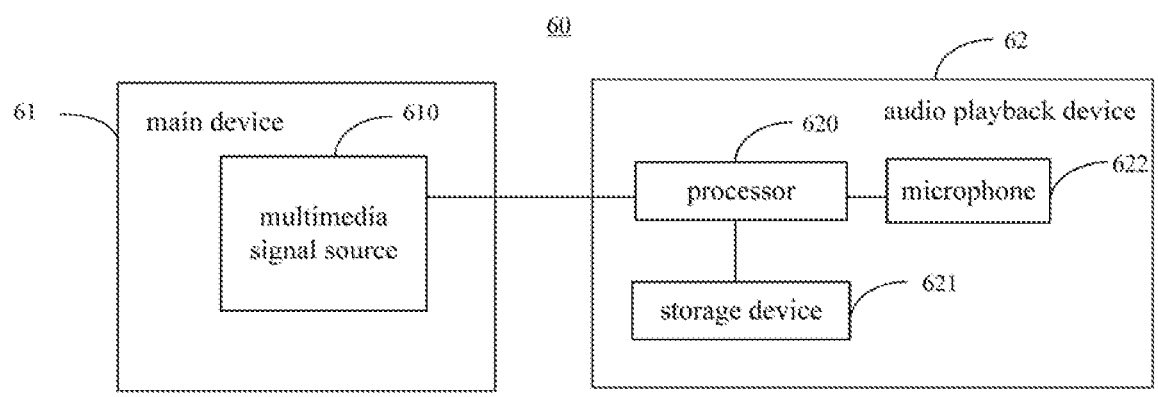
FIG. 6 schematically illustrates an audio system according to another embodiment of the present disclosure.

Referring to FIG. 6, FIG. 6 schematically illustrates an audio system 60 according to another embodiment of the present disclosure.

The audio system 60 which is applied to controlling audio playback includes a main device 61 and an audio playback device 62, where the audio playback device 62 is equipped with a processor 620, a storage device 621 and a microphone 622, the main device 61 communicates with the audio playback device 62, and is configured to provide a multimedia signal source 610.

In some embodiments, the audio playback device 62 may be a headphone, the processor 620 may be a chip embedded in the headphone, the storage device 621 may be a memory card in the headphone, and the microphone 622 may be an inline microphone integrated in the headphone through audio wires.

In some embodiments, the main device 61 may be a computer. In other embodiments, the main device 61 may be a mobile phone. The main device 61 communicates with the audio playback device 62 through a wire or wireless style.

Function of the processor 620, the storage device 621, the microphone 622, the audio playback device 62 and the multimedia signal source 610 can be referred to the corresponding elements shown in FIG. 5, which will not be discussed in detail herein.

It will be appreciated by those of ordinary skill in the art that all or a portion of the steps in the various methods of the embodiments described above may be performed by means of software or hardware. The software may include Visual Studio 2010 or above, Audiomulch, Debug with Visual Studio, Standalone Demo and Calibration/Recording Setup with Soundcard. The hardware in response to some computer programs may include Fireface UC soundcard, microphone input port, headphone output port, reference headphone with inline microphone, reference microphone for acoustic calibration, external loudspeaker for realistic noise environment simulation and so on. The computer programs may be stored in a computer-readable storage medium. The storage medium may be an optical disk, a magnetic disk, a Read-Only Memory (ROM), or a Random Access Memory (RAM), etc.

It should be noted that, reference microphone is not a part of a user terminal product, but a device to calibrate the audio playback device of headphone and microphone for detecting noises (such as the inline microphone) and to calibrate acoustic transfer function between the audio playback device and the microphone for detecting noises.

It should be noted that, for an accurate estimation of the audio signal and the noise signal, acoustic calibration should be applied to hardware involved in the method for adjusting the candidate audio signal before the method is started. Specifically, the audio playback device, the microphone and a noise path between the microphone and the audio playback device should be acoustically calibrated. In addition, crosstalk level between the audio playback device and the microphone signal should be measured to evaluate the crosstalk level impact on noise estimation, since time constants used to smooth music and noise are different, and the microphone sensitivity calibration may amplify the crosstalk level.

In conclusion, the present disclosure has the following advantages.

In presence of noise signals in the environment, a first plurality of difference values in loudness between the candidate audio signal and the current noise signal are calculated and modified with a plurality of target factors, and then the candidate audio signal are modified with the modified first plurality of difference values to obtain a target audio signal, so that the loudness loss of a perceived audio signal due to the competing sound of the noise signal can be compensated. The plurality of target factors are obtained based on a plurality of test noise signals and a corresponding plurality of test audio signals covering a broad frequency band, which makes the plurality of target factors adaptive to almost all of noise signals in the environment.

Further, the plurality of target factors are obtained for each bark in the bark domain, so that the first plurality of difference values can be modified at each bark, and the candidate audio signal can be adjusted accurately so as to avoid overcompensation as far as possible.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for obtaining a plurality of target factors for adjusting an audio signal, comprising:
    obtaining a test audio signal and a test noise signal, where the test noise signal has a frequency band covering a preset number of barks;
    obtaining a plurality of difference values in loudness between the test audio signal and the test noise signal; and
    determining a particular target factor of the plurality of target factors for a particular bark for modifying the plurality of difference values, where the particular target factor ranges from 0 to 1 and is determined based on a predetermined requirement.

2. The method according to claim 1, further comprising:
    repeating above steps until a first predetermined number of target factors for a first predetermined number of barks are obtained based on a plurality of test noise signals and a corresponding plurality of test audio signals.

3. The method according to claim 2, further comprising:
    obtaining a second predetermined number of target factors for a second predetermined number of barks, by using a linear interpolation method based on the first predetermined number of target factors and the first predetermined number of barks.

4. The method according to claim 1, wherein obtaining the plurality of difference values in loudness between the test audio signal and the test noise signal comprises:
    calculating Power Spectral Density (PSD) of the test audio signal in a frequency domain and PSD of the test noise signal in the frequency domain respectively;
    processing the PSD of the test audio signal in the frequency domain and the PSD of the test noise signal in the frequency domain with a psychoacoustic masking model respectively, to obtain an audio signal in a decibel (dB) scale in a bark domain and to obtain a noise signal in the dB scale in the bark domain; and
    calculating the plurality of difference values in the dB scale in the bark domain by performing a subtraction between the test audio signal in the dB scale in the bark domain and the test noise signal in the dB scale in the bark domain.

5. The method according to claim 4, wherein determining the particular target factor for the particular bark for modifying the plurality of difference values comprises:
    modifying the plurality of difference values in the dB scale in the bark domain with a particular factor, where the particular factor varies between 0 and 1;
    obtaining a plurality of linear gain values in a frequency domain based on the modified plurality of difference values in the dB scale in the bark domain;
    modifying the test audio signal with the plurality of linear gain values;
    monitoring playback of the modified test audio signal; and
    tuning the particular factor for the particular bark in the center of the frequency band of the test noise signal until the modified test audio signal meets the predetermined requirement.

6. The method according to claim 1, wherein the test noise signal has the frequency band overlapping at least part of a frequency band of the test audio signal, or has the frequency band covering 3 to 5 barks.

7. A method for adjusting an audio signal, comprising:
    obtaining a candidate audio signal;
    obtaining a current noise signal in an environment;
    calculating a first plurality of difference values in loudness between the candidate audio signal and the current noise signal;
    modifying the first plurality of difference values with a plurality of target factors, where the plurality of target factors are obtained based on a plurality of test noise signals and a corresponding plurality of test audio signals; and
    modifying the candidate audio signal with the modified first plurality of difference values to obtain a target audio signal.

8. The method according to claim 7, wherein obtaining the plurality of target factors based on the plurality of test noise signals and the corresponding plurality of test audio signals comprises:

obtaining a first predetermined number of target factors for a first predetermined number of barks, so as to obtain a relationship between the first predetermined number of target factors and the first predetermined number of barks, where each of the first predetermined number of barks is at a center of a frequency band of a test noise signal; and obtaining a second predetermined number of target factors corresponding to a second predetermined number of barks in a bark domain that are not at centers of frequency bands of the plurality of test noise signals, by using a linear interpolation method based on the relationship between the first predetermined number of target factors and the first predetermined number of barks.

9. The method according to claim 8, wherein obtaining a particular target factor of the predetermined number of target factors for a particular bark of the predetermined number of barks comprises:

obtaining a test noise signal and a test audio signal, wherein the test noise signal has a frequency band covering a preset number of barks;

obtaining a second plurality of difference values in a decibel (dB) scale in the bark domain by performing a subtraction between the test noise signal and the test audio signal;

modifying the second plurality of difference values in the dB scale in the bark domain with a particular target factor, where the particular target factor varies from 0 to 1;

obtaining a second plurality of linear gain values in a frequency domain based on the modified second plurality of difference values in the dB scale in the bark domain;

modifying the test audio signal with the second plurality of linear gain values;

monitoring playback of the modified test audio signal; and tuning the particular target factor for the particular bark in the center of the frequency band of the test noise signal until the modified test audio signal meets a predetermined requirement.

10. The method according to claim 9, wherein the test noise signal has the frequency band overlapping at least part of a frequency band of the test audio signal, or has the frequency band covering 3 to 5 barks.

11. The method according to claim 7, wherein the first plurality of difference values in loudness between the candidate audio signal and the current noise signal are obtained by:

obtaining a Power Spectral Density (PSD) of the candidate audio signal in a frequency domain and a PSD of the current noise signal in the frequency domain respectively;

processing the PSD of the candidate audio signal in the frequency domain and the PSD of the current noise signal in the frequency domain with a psychoacoustic masking model respectively, to obtain a candidate audio signal in a dB scale in a bark domain and a current noise signal in the dB scale in the bark domain; and obtaining a first plurality of difference values in the dB scale in the bark domain by performing a subtraction between the candidate audio signal in the dB scale in the bark domain and the current noise signal in the dB scale in the bark domain.

12. The method according to claim 11, wherein modifying the candidate audio signal with the modified first plurality of difference values to obtain the target audio signal comprises:

transforming the obtained first plurality of difference values in the dB scale in the bark domain to a third plurality of difference values in the dB scale in the frequency domain using a linear interpolation method;

obtaining a first plurality of linear gain values in the frequency domain based on the third plurality of difference values in the dB scale in the frequency domain; and performing a multiplication between the candidate audio signal and the first plurality of linear gain values in the frequency domain, to obtain the target audio signal in the frequency domain.

13. The method according to claim 12, further comprising:

transforming the target audio signal from the frequency domain to a time domain; and outputting the target audio signal in the time domain.

14. The method according to claim 11, further comprising:

performing a time and frequency smoothing and a non-linear smoothing successively to the PSD of the current noise signal in the frequency domain; and performing the time and frequency smoothing to the PSD of the candidate audio signal in the frequency domain, before processing the PSD of the candidate audio signal in the frequency domain and the PSD of the current noise signal in the frequency domain with the psychoacoustic masking model respectively.

15. The method according to claim 11, further comprising:

performing a tone correction to the PSD of the current noise signal in the frequency domain, before processing the PSD of the candidate audio signal in the frequency domain and the PSD of the current noise signal in the frequency domain with the psychoacoustic masking model respectively; and where the tone correction is obtained based on flatness measurements on a plurality of subbands.

16. The method according to claim 11, wherein the candidate audio signal is a multi-channel audio signal in a time domain, the method further comprises:

transforming the multi-channel audio signal from the time domain to the frequency domain; and averaging the multi-channel audio signal in the frequency domain to obtain a mono audio signal in the frequency domain so as to calculate PSD of the mono audio signal in the frequency domain as the PSD of the candidate audio signal in the frequency domain.

17. An audio system, comprising:

an audio playback device, configured to play audio signals;

a microphone, configured to detect noise signals in an environment;

a storage device configured to store a plurality of target factors, where the plurality of target factors are adapted to modify audio signals; and a processor configured to:

obtain a candidate audio signal to be played by the audio playback device;

obtain a current noise signal detected by the microphone;

calculate a first plurality of difference values in loudness between the candidate audio signal and the current noise signal;

modify the first plurality of difference values with the plurality of target factors;

modify the candidate audio signal with the modified first plurality of difference values to obtain a target audio signal; and control the audio playback device to play the target audio signal.

18. The audio system according to claim 17, wherein the processor is further configured to obtain the plurality of target factors according to:

a test audio signal and a test noise signal, where the test noise signal has a frequency band covering a preset number of barks;

a plurality of difference values in loudness between the test audio signal and the test noise signal; and a particular target factor of the plurality of target factors for a particular bark for modifying the plurality of difference values, where the particular target factor ranges from 0 to 1 and is determined based on a predetermined requirement.

19. The audio system according to claim 17, wherein the audio playback device is a headphone and the microphone is an inline microphone of the headphone, or the storage device and the processor are integrated in the audio playback device.

20. The audio system according to claim 17, further comprising a main device, where the audio playback device communicates with the main device, and the storage device and the processor are integrated in the main device.

* * * * *